(12) United States Patent
Kitada et al.

(10) Patent No.: US 7,731,825 B2
(45) Date of Patent: Jun. 8, 2010

(54) MANUFACTURING APPARATUS OF MAGNETORESISTANCE ELEMENTS

(75) Inventors: Toru Kitada, Tokyo (JP); Naoki Watanabe, Tokyo (JP); Shinji Takagi, Tokyo (JP); Shinji Furukawa, Tokyo (JP)

(73) Assignee: Canon Anelva Corporation, Kawasaki-Shi, Kanagawa (JP)

( * ) Notice: Subject to any disclaimer, the term of this patent is extended or adjusted under 35 U.S.C. 154(b) by 790 days.

(21) Appl. No.: 11/161,981

(22) Filed: Aug. 24, 2005

(65) Prior Publication Data
US 2006/0060466 A1    Mar. 23, 2006

(30) Foreign Application Priority Data
Sep. 17, 2004    (JP) .............................. 2004-272230

(51) Int. Cl.
C25B 9/00 (2006.01)
C25B 11/00 (2006.01)
C25B 13/00 (2006.01)
C23C 14/00 (2006.01)

(52) U.S. Cl. .............................. 204/298.02; 204/298.01
(58) Field of Classification Search ............ 204/192.11, 204/192.12; 360/324.1
See application file for complete search history.

(56) References Cited

U.S. PATENT DOCUMENTS

| | | | | |
|---|---|---|---|---|
| 5,871,622 A * | 2/1999 | Pinarbasi | ................ | 204/192.11 |
| 6,063,244 A * | 5/2000 | Pinarbasi | ................ | 204/192.11 |
| 6,200,431 B1 * | 3/2001 | Sone | ................ | 204/192.12 |
| 6,478,931 B1 * | 11/2002 | Wadley et al. | .......... | 204/192.12 |
| 6,700,754 B2 * | 3/2004 | Kula et al. | ................ | 360/324.1 |
| 6,720,036 B2 | 4/2004 | Tsunekawa et al. | .......... | 427/535 |
| 6,731,477 B2 * | 5/2004 | Lin et al. | ................ | 360/324.1 |
| 2002/0064595 A1 * | 5/2002 | Nomura et al. | ............. | 427/131 |
| 2003/0049389 A1 * | 3/2003 | Tsunekawa et al. | .......... | 427/569 |

FOREIGN PATENT DOCUMENTS

JP    10-219442    8/1998

(Continued)

OTHER PUBLICATIONS

Notice of Reason(s) for Refusal in JP 2003-077888 dated Nov. 6, 2008, and English Translation thereof.

*Primary Examiner*—Alexa D Neckel
*Assistant Examiner*—Michael Band
(74) *Attorney, Agent, or Firm*—Buchanan Ingersoll & Rooney PC

(57) ABSTRACT

A manufacturing method of a magnetoresistance element having a pinned magnetic layer, a non-magnetic intermediate layer, and a free magnetic layer, the method includes forming at least one thin film of the non-magnetic intermediate layer and the free magnetic layer at a pressure of $8.0 \times 10^{-3}$ Pa or less in the vicinity of a substrate using a sputtering apparatus. The apparatus includes a vacuum chamber in which a cathode and a substrate holder are arranged, a first exhausting apparatus connected to an exhausting port of the vacuum chamber, a gas introduction mechanism to introduce a gas toward the target, a first pressure regulator to cause a pressure difference between a target space and a center space outside the target space, a second pressure regulator to cause a pressure difference between the center space and a substrate space, and a second exhausting apparatus to exhaust the center space.

4 Claims, 8 Drawing Sheets

FOREIGN PATENT DOCUMENTS

| | | |
|---|---|---|
| JP | 11-302838 | 11/1999 |
| JP | 2000-336477 | 12/2000 |
| JP | 2002-249872 | 9/2002 |
| JP | 2003-86866 | 3/2003 |
| JP | 2004-285392 | 10/2004 |

* cited by examiner

MANUFACTURING APPARATUS OF MAGNETORESISTANCE ELEMENTS

CROSS-REFERENCE TO RELATED APPLICATIONS

The present application claims the priority of JP 2004-272230, filed in Japan on Sep. 17, 2004, the entire contents of which are incorporated herein by reference.

BACKGROUND OF THE INVENTION

The present invention relates to a manufacturing method and a manufacturing apparatus of a magnetoresistance element, and in particular to the manufacturing method of magnetoresistance elements having excellent magnetic characteristics like a magneto-resistance ratio (MR ratio).

DESCRIPTION OF RELATED ART

Magnetoresistive elements such as a Giant Magneto Resistance (GMR) element and a Tunnel Magnetic Resistance (TMR) element have a multilayered structure which is composed of an anti-ferromagnetic layer, a pinned magnetic layer, a non-magnetic intermediate layer, and a free magnetic layer to have a large magneto-resistance ratio (MR ratio), and therefore are practically used for high density magnetic devices such as a magnetic head and a nonvolatile random access memory (MRAM).

In recent years, the recording density of magnetic devices has greatly increased. As a result, the magnetic head, for example, is required to have higher output and high-speed operation. For this reason, a variety of examinations on, for example, the film quality, the processing method of each layer and the structure of multi-layers have been carried out to further improve the magnetic characteristics. In the case of, e.g., the GMR element, it is reported that the MR ratio can be enhanced by the insertion of a very thin oxide layer NOL (Nano-Oxide Layer) having a thickness of 1 nm or less between films forming the pinned magnetic layer.

Moreover, the MR ratio is also enhanced by carrying out the plasma processing on the surface of a thin film of the anti-ferromagnetic layer and the non-magnetic intermediate layer (JP2003-86866A).

SUMMARY

As described, the MR ratio can be enhanced to some extent by inserting an oxide layer NOL between the multi-layers of the GMR element, or by carrying out plasma processing. Since the GMR element is composed of very thin metallic films with a thickness of nanometer level, the GMR characteristics depend on the quality, thickness uniformity and flatness of each metallic thin film. Therefore, in order to further enhance GMR characteristics, it is inevitable to improve the film properties for each film, and to establish a film forming method which enables the formation of such films with sufficient reproducibility.

Then, the present inventors examined various film forming methods and conditions to provide the multilayered structure of nanometer-order thin films, and found that the quality and flatness of each film had a close relation with the forming conditions, especially pressure during the sputtering. That is, the MR ratio was varied with the sputtering pressure. In parallel with such examinations, the present inventors have studied a low-pressure sputtering apparatus, and developed a magnetron sputtering apparatus which makes a very low pressure of about $10^{-4}$ Pa in the vicinity of a substrate while the plasma discharge is stably maintained (JP 2003-77888).

The non-magnetic intermediate layer was formed at a low pressure of $2.0 \times 10^{-3}$ Pa or less using the low-pressure sputtering apparatus. The film thus obtained was found to have higher properties. For example, the specific resistance was decreased. The thickness uniformity and flatness of the film were also improved, resulting in the increase of MR ratio.

This is also true in the case of MRAM and TMR element. The conventional sputtering apparatuses cannot cope with the reproducible formation of high quality films when the films to be stacked become as thin as one-atom or several-atom thickness.

An object of the present invention is to provide a manufacturing method and a manufacturing apparatus of a magnetoresistance element to manufacture, e.g., GMR elements and TMR elements having excellent magnetic characteristics like magneto-resistance ratio (MR ratio).

According to one embodiment, a manufacturing method of the present invention for manufacturing a magnetoresistance element composed of a pinned magnetic layer, a non-magnetic intermediate layer, and a free magnetic layer, comprises forming at least one thin film of said non-magnetic intermediate layer and said free magnetic layer at a pressure of $8.0 \times 10^{-3}$ Pa or less in the vicinity of a substrate, by using a sputtering apparatus.

The non-magnetic intermediate layer can be formed at a low pressure of $8.0 \times 10^{-3}$ Pa or less by using a magnetron sputtering method, which improves the MR ratio as well as the uniformity of the film thickness and the flatness. As a result, the product yield of GMR and TMR elements is greatly increased. This is also true for the film of free magnetic layer.

In one embodiment of this invention, the non-magnetic intermediate layer is a non-magnetic conductive layer such as a Cu film in the case of GMR element, and a tunneling barrier layer such as an $Al_2O_3$ film in the case of TMR element. Here, the sputtering apparatus comprises a vacuum chamber in which a cathode holding a target and a substrate holder holding said substrate are arranged, a first exhausting apparatus connected to an exhausting port of said vacuum chamber, a gas introduction mechanism to introduce a (process) gas to a target space in the vicinity of a surface of said target, a first pressure regulator to cause a pressure difference between said target space and a center space which lies outside said target space, a second pressure regulator to cause a pressure difference between said center space and a substrate space in the vicinity of a surface of said substrate, and a second exhausting apparatus to exhaust said center space.

By using such a sputtering apparatus, it becomes possible to make the pressure near the substrate lower than $8.0 \times 10^{-3}$ Pa. That is, the first and second pressure regulator are arranged to cause the pressure difference among the target space, the substrate space and the center space, and in addition the second exhausting apparatus is arranged to exhaust the center space. This construction reduces the amount of the process gas flowing toward the substrate and increases the pressure difference between the target space and the substrate space. As a result, it becomes possible to make the pressure near the substrate lower while maintaining stable sputtering discharge.

The first pressure regulator is arranged to restrict the gas flowing from the target surface and its vicinity to the center space. The first pressure regulator may be, for example, a tapered cylinder member whose diameter decreases toward the substrate, or a cylinder member whose end at the substrate side is covered with a plate having at least one hole. The member is arranged so as to surround the target.

With the construction of first regulator, the pressure can be set to a lower value in the vicinity of the substrate. Particularly when the cylinder member whose end at the substrate side is covered with a plate having a plurality of holes is employed, it is possible by adjusting the size and length of holes to make the pressure much lower in the vicinity of the substrate and to improve the vertical incidence of sputtering particles to the substrate.

The second pressure regulator can also have the same shape as the first pressure regulator. Furthermore, the means can be constructed by arranging a partition member having at least one hole so as to divide the inside of the vacuum chamber into a target side and a substrate side. Both the first and the second pressure regulator can be such a partition member.

In this invention, at least two pressure regulator are arranged. Therefore, three or more pressure regulator can be arranged according to demand.

As has been mentioned, by forming at least one thin film which constitutes the non-magnetic intermediate layer or the free magnetic layer at a pressure of $8.0 \times 10^{-3}$ Pa or less, the MR ratio, the film thickness uniformity, and the film flatness can be greatly improved, which makes it possible to manufacture high characteristic GMR elements and TMR elements with a higher production yield.

Thus, the magnetic heads with high output and high sensitivity can be obtained to realize high-density hard discs and MRAM.

DETAILED DESCRIPTION OF THE PREFERRED EMBODIMENTS

Here, numeral 1 denotes vacuum chamber,
2 magnetron cathode,
3 target,
4 backing plate,
5 magnet unit,
6 insulating member,
7 substrate,
8 substrate holder,
9 gas introduction pipe,
11 first exhausting apparatus,
12 and 12' second exhausting apparatus,
13 first pressure regulator,
13a and 14a hole,
14 second pressure regulator,
17 and 17' exhausting port,
19 and 19' main valve,
20 low-pressure sputtering chamber,
21 load lock chamber,
22 through 24 sputtering chamber,
25 oxidization chamber,
26 gate valve,
27 transfer chamber, and
28 robot.

The embodiment of this invention is explained below, based on the drawings.

Embodiment 1

As an example of manufacturing methods of this invention, a method used for manufacturing a GMR element having a multilayered structure shown in FIG. 9A will be explained.

Figure 1:
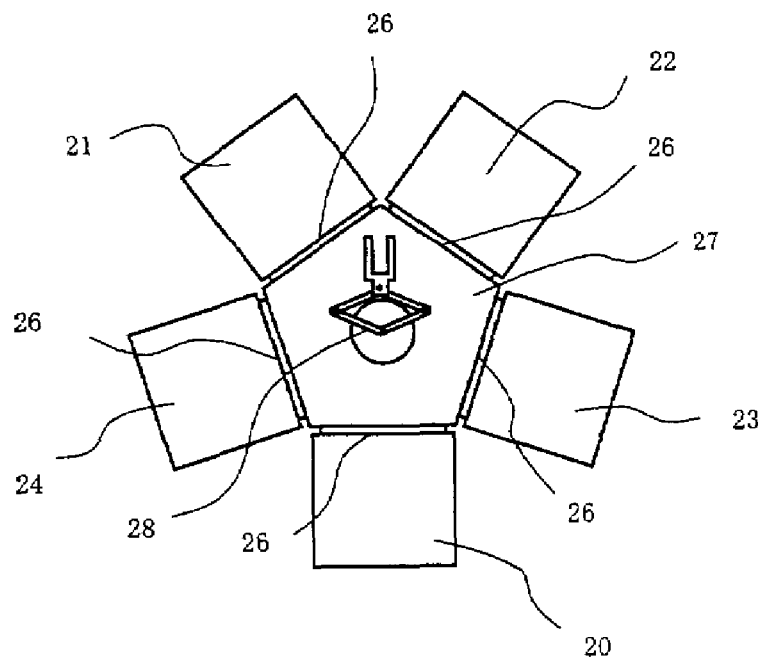
FIG. 1 is a schematic sectional view showing a magnetoresistance film manufacturing apparatus of Embodiment 1.
Figure 9A:
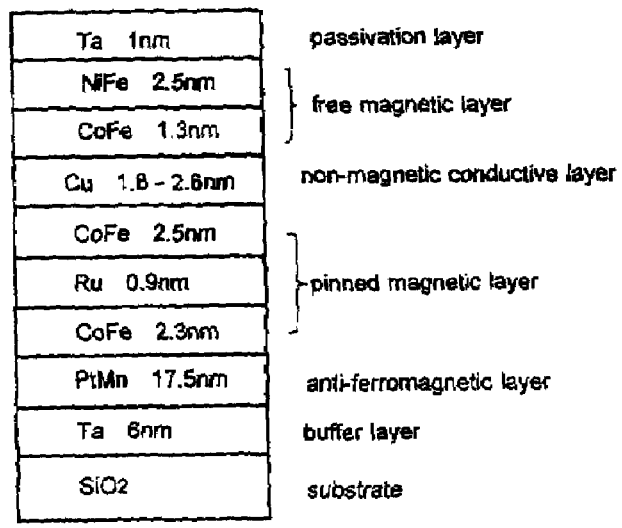
FIGS. 9A and 9B are multilayered structures of a GMR element and a TMR element, respectively.

FIG. 1 is an apparatus suitably used for manufacturing the magnetoresistance element shown in FIG. 9A. The manufacturing apparatus is composed of a first sputtering chamber 22 for forming a buffer layer Ta and an anti-ferromagnetic layer PtMn, a second sputtering chamber 23 for forming a pinned magnetic layer (CoFe/Ru/CoFe), a low-pressure sputtering chamber 20 for forming a non-magnetic intermediate layer Cu at a low pressure of $10^{-3}$ Pa or less, a third sputtering chamber 24 for forming a free magnetic layer (CoFe/NiFe) and a passivation layer Ta, a load lock chamber 21 which stores cassettes holding a plurality of substrates, and a transfer chamber 27 in which a robot 28 is installed to transfer a substrate. The chambers 20-24 are connected through gate valves 26 to the periphery of the transfer chamber 27. In the sputtering chamber to which a gas supply system and at least one exhausting apparatus are connected, at least one magnetron cathode equipped with a target is arranged corresponding to the film to be formed.

Here, the low-pressure sputtering chamber 20 is explained with reference to FIG. 3. The first through third sputtering chambers are conventional sputtering chambers having well-known structure.

Figure 3:
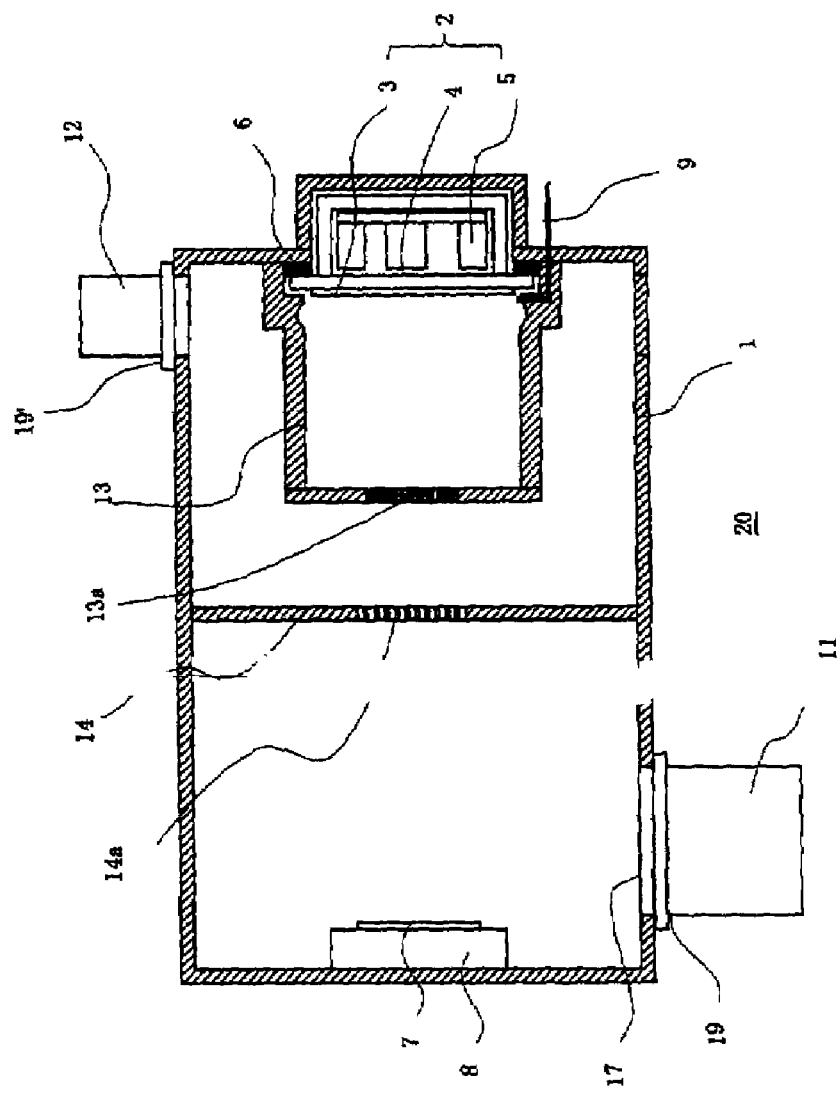
FIG. 3 is a schematic sectional view showing a low-pressure sputtering chamber.

The low-pressure sputtering chamber 20 is constructed such that a magnetron cathode 2 which is composed of a Cu target 3, a backing plate 4 and a magnet unit 5 is arranged facing a substrate holder 8 holding a substrate 7 in a vacuum chamber 1, as shown in FIG. 3. There is provided a gas introduction pipe 9 on the target side of the vacuum chamber 1 to discharge a process gas toward the surface of the target 3, and is provided an exhausting port 17 on the substrate holder side to attach a first exhausting apparatus 11 (for example, a turbo molecular pump) through a main valve 19. The magnetron cathode 2 is fixed to the vacuum chamber 1 through an insulating member 6, and connected to a direct current power source or a high frequency power source (not illustrated). The gas introduction pipe 9 is connected to a gas supply system (not illustrated).

A first pressure regulator and a second pressure regulator are arranged in order to cause a pressure difference in the vacuum chamber. That is, as the first pressure regulator 13, a cylinder member whose end on the substrate side is closed with a plate having a plurality of holes 13a is arranged so as to surround the target. As the second pressure regulator 14, a partition plate with a plurality of holes 14a is employed to divide the inside of vacuum chamber 1. In addition, in this embodiment, a second exhausting apparatus 12 is arranged to exhaust the center space, which is surrounded by the first pressure regulator and the second pressure regulator.

For the first and the second pressure regulators, the holes 13a, 14a are preferably provided symmetrically around the central axis of target. The size of holes is 1-30 mm in diameter (preferably 5-20 mm). It is preferable to make the holes of the second pressure regulator large as compared with those of the first pressure regulator. There is no particular restriction in the length of hole (or the thickness of plate), but a length of about 5-20 mm is usually employed.

As mentioned above, the size and the number of the holes in the first and second pressure regulators, and the number, the exhausting capacity and the position of the first and second exhausting apparatuses are suitably selected, which makes it possible to realize the pressure of $1.0\times10^{-4}$ Pa near the substrate when the pressure near the target is set to, e.g., $1.0\times10^{-2}$ Pa.

It is also possible by adjusting the size and thickness of the holes to improve the vertical incidence of sputtering particles onto the substrate.

Next, the manufacturing method of the GMR element shown in FIG. 9A will be explained using the manufacturing apparatus of FIG. 1.

First, the cassette holding a lot of quartz glass substrates is transported into the load lock chamber 21, and the chamber is exhausted. The gate valves are opened so that the transfer robot 28 takes out a substrate from the cassette and places it on the substrate holder of the first sputtering chamber 22. The inside of the sputtering chamber 22 is exhausted to a high vacuum. Then, Ar gas is introduced at a prescribed flow rate and a Ta buffer layer is formed on the $SiO_2$ plate. Similarly, a PtMn anti-ferromagnetic layer is formed thereon.

After that, the substrate is transferred to the chambers in the order of the second sputtering chamber 23, the low-pressure sputtering chamber 20, and the third sputtering chamber 24 to form the thin films in respective chambers. At the same time, the other substrates are continuously taken out from the cassette of the load lock chamber 21 and transferred similarly to manufacture the GMR multilayered element. After a Ta passivation layer is formed, the substrate is returned to the cassette of the load lock chamber. Thus the substrates are placed in a highly clean atmosphere while all films are formed, which prevents the film interfaces from contamination to obtain high quality GMR elements.

The film forming procedure in the low-pressure sputtering chamber 20 is explained below. The substrate 7 on which the pinned magnetic layer has already been formed is transferred into the low-pressure sputtering chamber through the gate valve 26 and is placed on the substrate holder 8. The gate valve 26 is closed and the vacuum chamber 1 is exhausted to high vacuum by the exhausting apparatuses 11, 12. After a predetermined period, Ar gas is introduced at a predetermined flow rate from the gas supply system. Then, the high frequency power is supplied to the cathode from a high frequency power supply (not illustrated) to generate plasma discharge. The main valve 19' is adjusted to set the pressure in the vicinity of the target to about $1.0\times10^{-2}$ Pa, maintaining the plasma discharge. Then, the main valve 19 is adjusted to set the pressure in the vicinity of the substrate to a predetermined value of, e.g., $8.0\times10^{-3}$ Pa or less.

Then, a shutter (not illustrated) is opened and a Cu film is formed on the CoFe film of the substrate. When the film with a predetermined thickness is formed, the power supply and the gas introduction are stopped. After the chamber is exhausted to high vacuum, the gate valve 26 is opened. The robot 28 picks up the substrate 7 and transfers it to the third sputtering chamber 24 to form the free magnetic layer and the passivation layer thereon. In the mean time, another substrate, which the pinned magnetic layer has been formed in the second sputtering chamber 23, is transferred to the low-pressure sputtering chamber 20 to similarly form a Cu film.

Here, the experiment result is concretely explained. A GMR element having the multilayered structure as shown in FIG. 9A was manufactured. The thickness of Cu film was 1.8-2.6 nm. When the Cu film was formed, the pressure was set to $1.0\times10^{-2}$ Pa near the target and $8.0\times10^{-4}$ Pa near the substrate. In contrast, the pressure was set to $2.4\times10^{-2}$-$2.2\times10^{-1}$ Pa when the other films were formed. The MR ratios of the GMR elements thus fabricated were measured and shown in FIG. 4. The comparison sample of GMR element was also manufactured using the conventional apparatus. In this case, the Cu film was formed using the conventional sputtering chamber instead of the low-pressure sputtering chamber of FIG. 3. The MR ratios of the GMR elements were also measured and summarized in FIG. 4. The pressure near the substrate (or the pressure of sputtering chamber) was set to $3.6\times10^{-2}$ Pa when the Cu film was formed in the conventional sputtering chamber.

Figure 4:
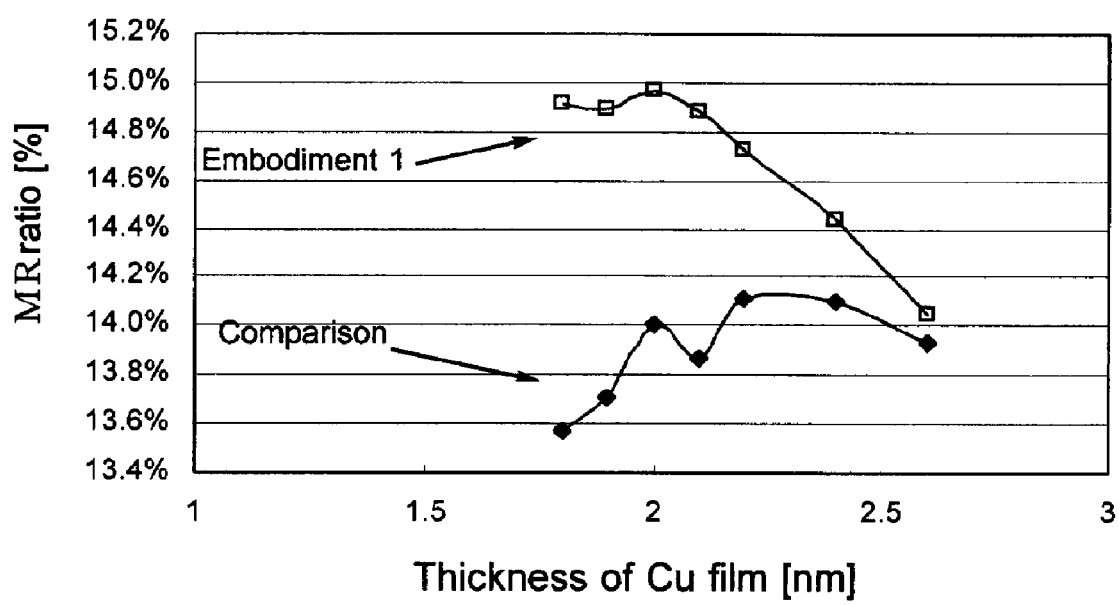
FIG. 4 is a graph showing the relation between the MR ratio and the thickness of Cu film.

It is apparent from FIG. 4 that the MR ratio is improved by forming the non-magnetic intermediate film using the low-pressure magnetron sputtering method. The difference becomes remarkable, as the Cu film is thinner. The Cu film formed in this embodiment has a high quality and excellent thickness uniformity even in the case where the film is ultra thin.

When the Cu film of GMR film is 1.8 nm, the coercive force Hcf of the free magnetic layer was decreased to $1.97\times10\,2$ A/m from $2.17\times10\,2$ A/m (comparison sample).

The Cu film with a thickness of 20 nm was formed at a sputtering pressure of $3.0\times10^{-2}$ Pa in the conventional sputtering chamber. The specific resistance of the Cu film thus obtained was 5.1 μΩcm. On the other hand, the specific resistance was decreased to 4.6 μΩcm when the pressure near the substrate was decreased to $3.0\times10^{-3}$ Pa in the low-pressure sputtering chamber.

As mentioned, the magnetic characteristics of the GMR element are greatly improved by decreasing the sputtering pressure for the non-magnetic intermediate layer from $3.6\times10^{-2}$ Pa to $8\times10^{-4}$ Pa. The improvement of the magnetic characteristics may be explained as follows. That is, when the pressure near the substrate is made lower, the amount of sputtering gas such as Ar gas contained in the film is decreased to improve the film quality. The substrate is hardly exposed to the plasma unlike the conventional method. Furthermore, the surface roughness Ra is decreased to improve the flatness of film.

The GMR element was also manufactured at a sputtering pressure of $8.0\times10^{-3}$ Pa for the non-magnetic intermediate layer. The result was nearly the same as that formed at a sputtering pressure of $8.0\times10^{-4}$ Pa.

Next, the Cu target was exchanged with the CoFe target or the NiFe target for the free magnetic layer in the manufacturing apparatus of FIG. 1, and a CoFe film (or NiFe film) of the free magnetic layer was formed at a pressure of $8.0\times10^{-3}$ Pa near the substrate in the low-pressure sputtering chamber. The GMR element was manufactured in the same manner as mentioned except for these film forming processes. The MR ratio was increased by forming the CoFe film or NiFe film of the free magnetic layer in the low sputtering chamber as compared with the comparison samples described above. That is, it was found that the magnetic characteristics of GMR element can be improved by forming at least one of the films which constitute the non-magnetic intermediate layer and the free magnetic layer at a very low pressure.

In the low-pressure sputtering chamber shown in FIG. 3, the gas introduction pipe is provided to discharge the gas toward the target through one outlet. However, it is preferable to arrange a plurality of gas outlets symmetrically to the target. The second exhausting apparatus is not restricted to one, and therefore a plurality of apparatuses can be arranged.

Figure 5:
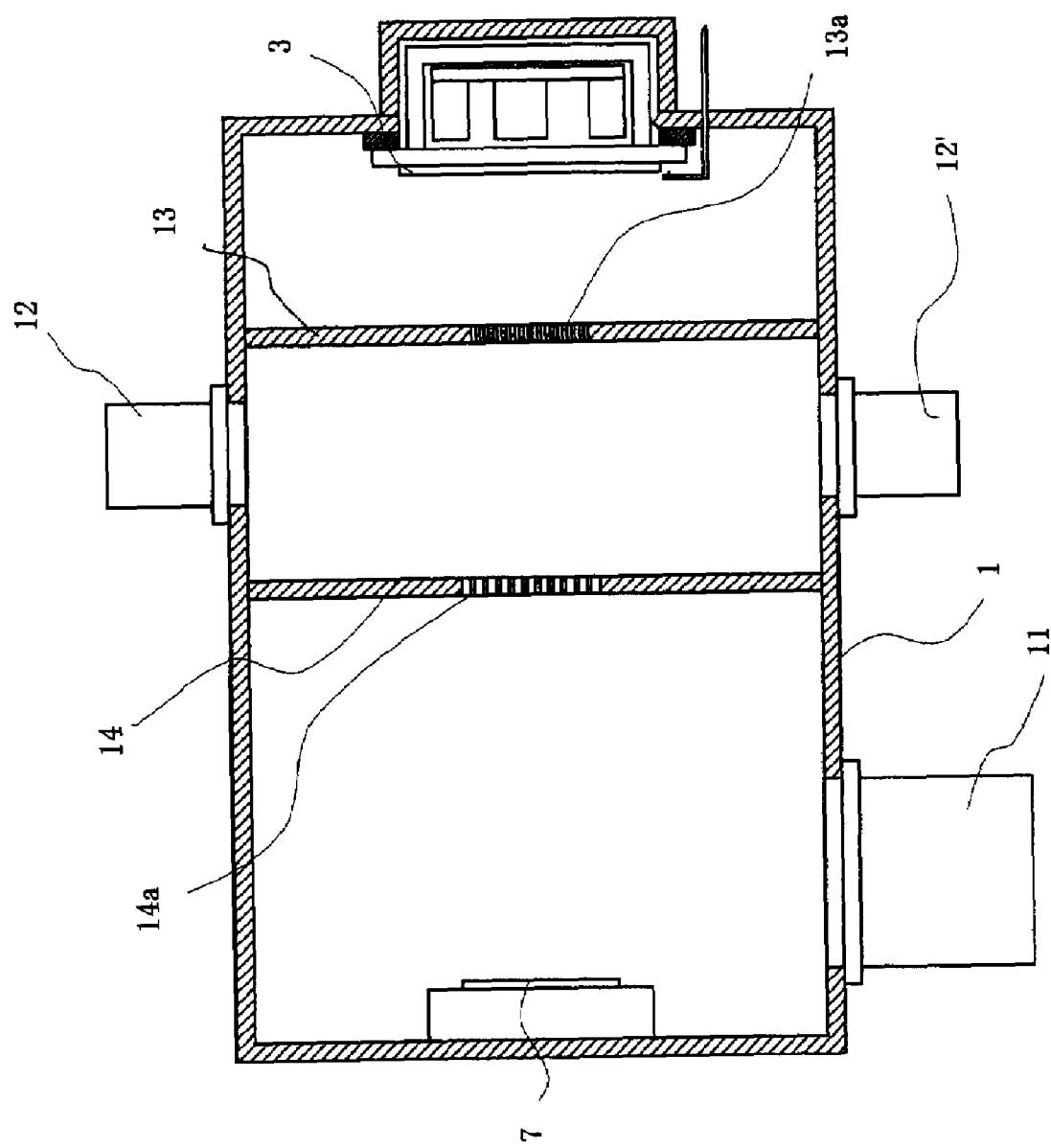
FIG. 5 is a schematic sectional view showing another low-pressure sputtering chamber.

Although the cylinder member is used for the first pressure regulator in FIG. 3, a partition plate 13 may be employed in the same way as shown in FIG. 5. In addition, another exhausting apparatus may be arranged to exhaust the target space in FIG. 5.

The cluster type manufacturing apparatus is employed in this embodiment. However the in-line type apparatus in which the chambers are linearly arranged can be also employed.

Embodiment 2

Figure 2:
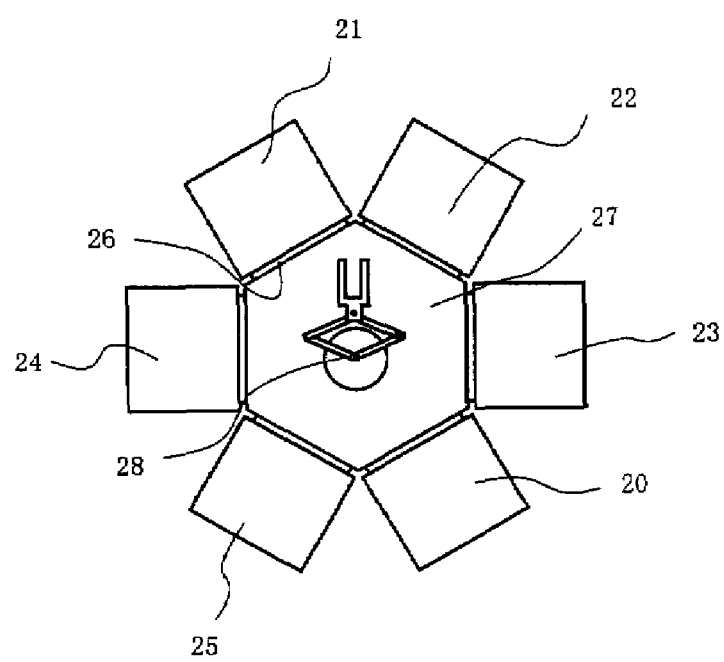
FIG. 2 is a schematic sectional view showing a magnetoresistance film manufacturing apparatus of Embodiment 2.
Figure 9B:
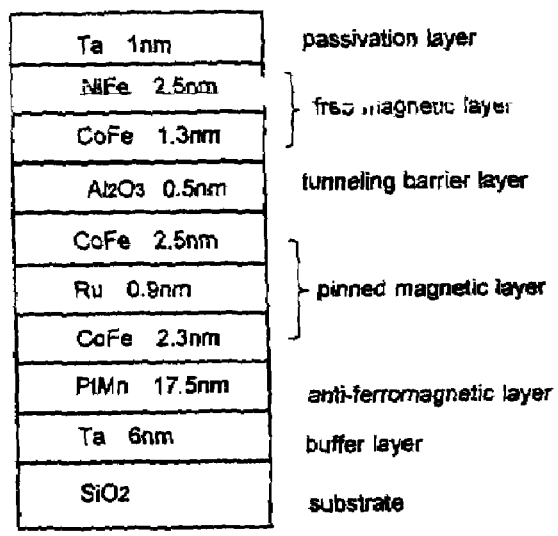

In this embodiment, a manufacturing method of a TMR element shown in FIG. 9B will be explained by referring to a manufacturing apparatus shown in FIG. 2 which is preferably used for manufacturing the TMR element.

The manufacturing apparatus is composed of a first sputtering chamber 22 for forming a buffer layer Ta and an anti-ferromagnetic layer PtMn, a second sputtering chamber 23 for forming a pinned magnetic layer (CoFe/Ru/CoFe), a low-pressure sputtering chamber 20 for forming an aluminum film at a low pressure of $8.0 \times 10^{-3}$ Pa or less for a tunnel barrier layer use, an oxidation chamber 25 to oxidize the aluminum film to form a tunnel barrier layer $Al_2O_3$, a third sputtering chamber 24 for forming a free magnetic layer (CoFe/NiFe) and a passivation layer Ta, a load lock chamber 21 which stores cassettes holding a plurality of substrates, and a transfer chamber 27 in which a robot 28 is installed to transfer a substrate. These chambers 20-25 are connected through gate valves 26 to the periphery of the transfer chamber 27. The structure of a low-pressure sputtering chamber 20 is the same as that of Embodiment 1.

The oxidation chamber 25 is equipped with an oxygen gas supply system (not illustrated) to introduce an oxygen gas onto a substrate to oxidize only the aluminum film formed on the pinned magnetic layer. Other oxidation methods may also be employed. For example, the substrate is heated to a predetermined temperature and then oxidized, or the substrate is exposed to the oxygen plasma. A dense aluminum film, which is flat, uniform and free of impurity mixing, is formed by the low-pressure sputtering at a pressure of $8.0 \times 10^{-3}$ Pa or less. Therefore, the oxidation of the aluminum film in the oxidation chamber provides a high quality barrier layer.

The film forming procedure of the TMR element is the nearly the same as that of the GMR element. That is, at least one of the films constituting the tunneling barrier layer and the free magnetic layer of the TMR element is formed by the low-pressure sputtering method, which can improve the film quality and flatness. Thus the magnetic characteristics of the TMR elements are improved as well as the GMR elements.

In this embodiment, the aluminum film is formed in the low-pressure sputtering chamber and then oxidized in the oxidation chamber to provide the $A_2O_3$ film used for the tunneling barrier film. But the $Al_2O_3$ film can be directly formed on the substrate by a reactive sputtering method in which Ar gas containing oxygen gas is introduced to the low-pressure chamber, or by using an $Al_2O_3$ target.

Figure 6:
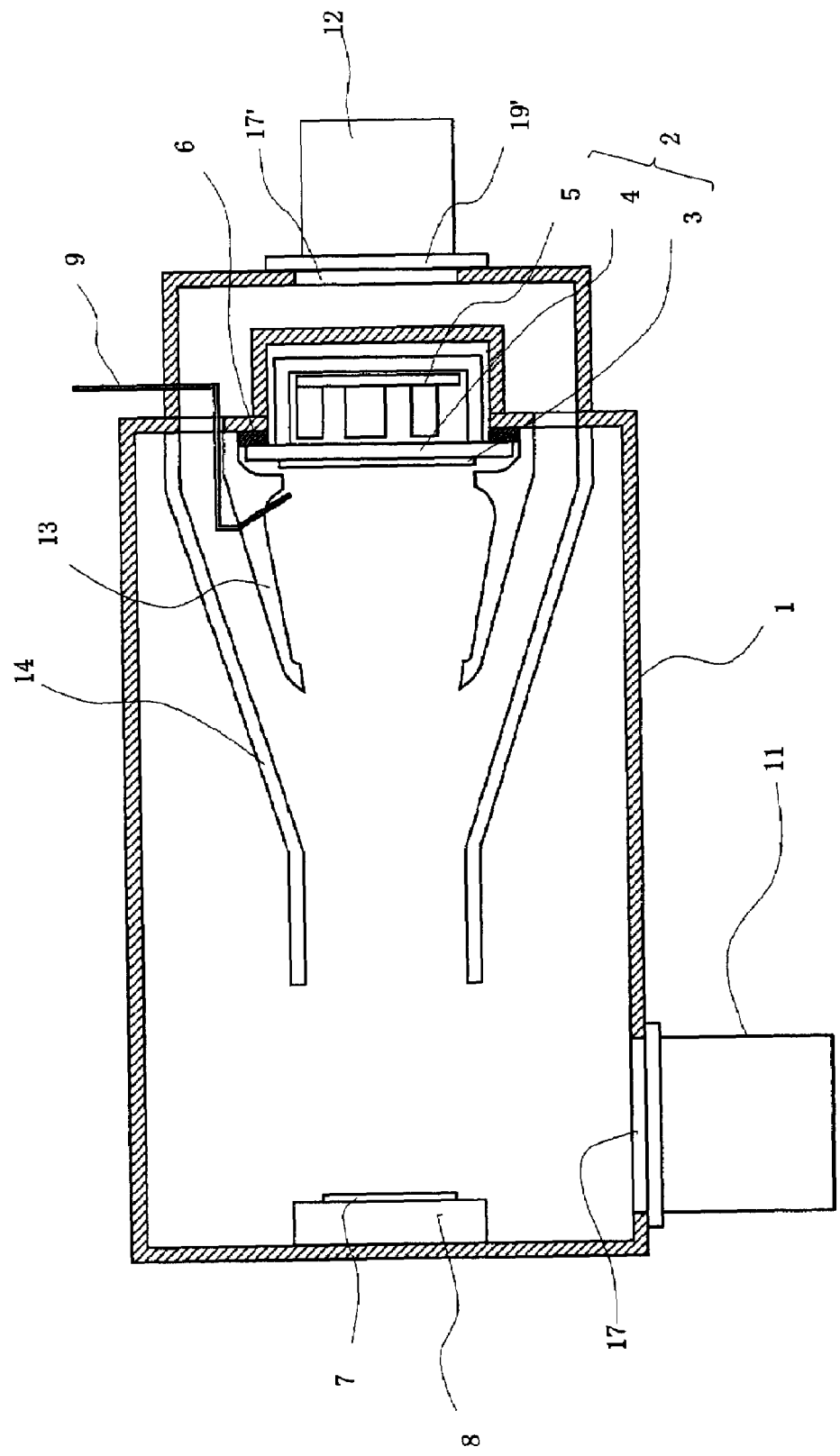
FIG. 6 is a schematic sectional view showing another low-pressure sputtering chamber.
Figure 7:
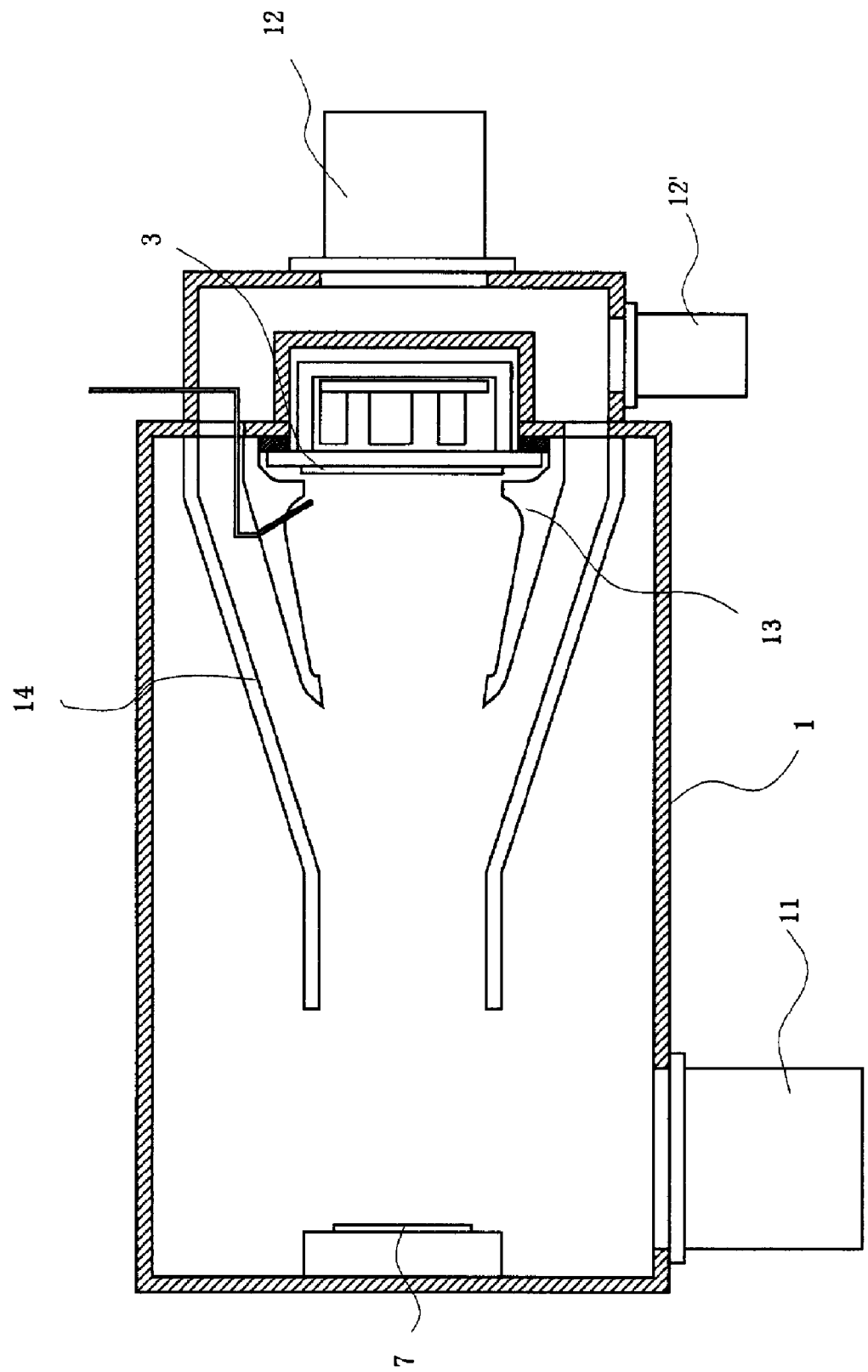
FIG. 7 is a schematic sectional view showing another low-pressure sputtering chamber.
Figure 8:
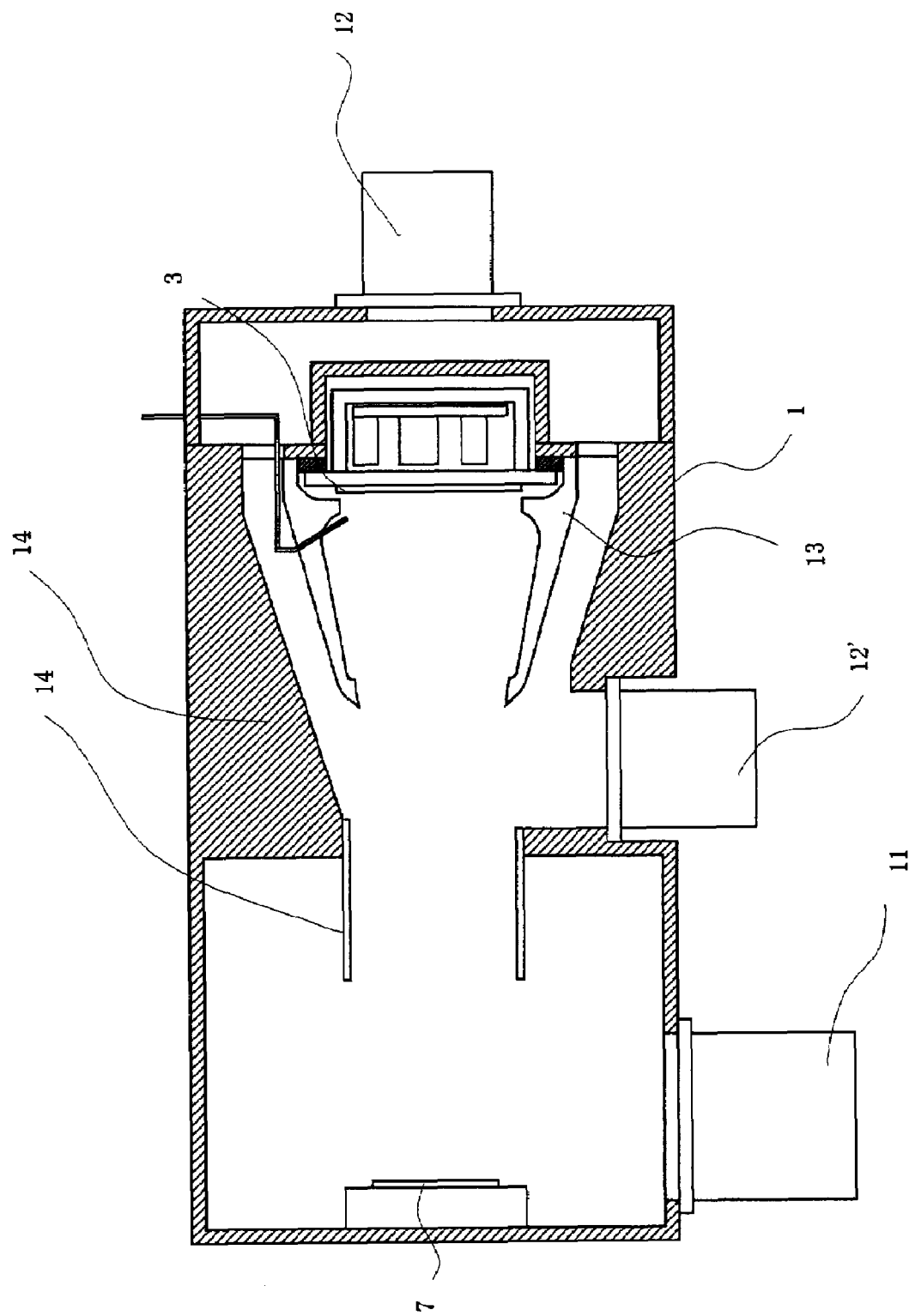
FIG. 8 is a schematic sectional view showing another low-pressure sputtering chamber.

In the present invention, the low-pressure sputtering chambers shown in FIGS. 6-8 are also preferably employed in addition to those shown in FIGS. 3 and 5.

In the sputtering chamber shown in FIG. 6, the first pressure regulator 13 is a tapered, nozzle-shaped member arranged to surround the target 3. The second pressure regulator 14 is arranged outside the first pressure regulating member 13 and is composed of a tapered, nozzle-shaped member and a cylinder attached to the end of the member.

Furthermore, an exhausting port 17' which is communicated with the space between the first and second pressure regulators (the center space) is provided behind the magnetron cathode 2 and the second exhausting apparatus (for example, turbo-molecular pump) 12 is attached to the exhausting port 17' through a main valve 19'.

As mentioned, the first pressure regulator 13 is a tapered, nozzle-shaped member and the second pressure regulator 14 comprises the tapered, nozzle-shaped member and the cylinder in FIG. 6. One regulator may have the shape of the other regulator or both regulators may have the same shape. The exhausting capacity of second exhausting apparatus 12 can be made smaller than the first exhausting apparatus 11. The exhaust rates of first and second exhausting apparatuses, together with the length and the degree of taper of the first and the second pressure regulators, are determined depending on the required pressure near the substrate.

The arrangement of these two pressure regulators can reduce the pressure in the order of the target surface space, the outlet of the first pressure regulator and the outlet the second pressure regulator. In addition, since part of the gas is directly discharged outside at the outlet of first pressure regulator by the second exhausting apparatus, the amount of gas flowing toward the substrate is decreased to further lower the pressure at the outlet of second pressure regulator. Therefore, it is possible to set the pressure in the vicinity of the substrate to $8.0 \times 10^{-3}$ Pa or less, optimal to form high function thin films, while the plasma discharge is stably maintained at the pressure of about $3.0 \times 10^{-2}$ Pa in the vicinity of the target.

Two second exhausting apparatuses 12, 12' are arranged in the sputtering chamber shown in FIG. 7. One exhausting apparatus is arranged behind the cathode 2 and the other is arranged on the sidewall of the vacuum chamber beside the cathode. The structure other than the exhausting apparatuses is the same as that shown in FIG. 6.

In the sputtering chamber shown in FIG. 8, the second pressure regulator 14 comprises a part of the wall of the vacuum chamber. One of exhausting apparatuses 12, 12' is arranged behind the cathode and the other is arranged on the wall which is a part of the second pressure regulator. Thus, the arrangement of a plurality of exhausting apparatuses can make larger pressure difference between the substrate space and the target space. Sputtering chambers with two pressure regulators have been mentioned so far. Sputtering chambers of this invention are not restricted to these chambers and can have three or more pressure regulator depending on the required pressure in the vicinity of the substrate.

In addition, the present invention is applied to not only the so-called bottom-type magnetoresistance elements as shown in FIG. 9, but also to the other type elements such a top-type, dual-type and the like.

What is claimed is:

1. A sputtering apparatus for manufacturing a magnetoresistance element with a pinned magnetic layer, a non-magnetic intermediate layer, and a free magnetic layer, said apparatus comprising:
   a chamber;
   a cathode which is configured and positioned in said chamber to hold a target for forming at least a thin film of the non-magnetic intermediate layer or the free magnetic layer;
   a substrate holder which is configured and positioned in said chamber to hold a substrate;
   a gas introduction mechanism which introduces a gas to a target space in a vicinity of a surface of the target;

a first partition member which is composed of a first tapered cylinder member whose diameter is decreased toward the substrate, and is arranged so as to surround the target and which restricts gas flow at a position between the target and the substrate, the target space being formed within the first tapered cylinder member;

a second partition member which is composed of a second tapered cylinder member whose diameter is decreased toward the substrate, and is arranged so as to surround the first tapered cylinder member and the substrate, and which restricts gas flow at a position between the first tapered cylinder member and the substrate, a center space being formed between the first tapered cylinder member and the second tapered cylinder member, and a substrate space being formed outside the second tapered cylinder member;

a first exhausting apparatus which exhausts the substrate space and makes the substrate space at a pressure lower than a pressure of said center space; and a second exhausting apparatus which exhausts said center space and makes said center space at a pressure lower than a pressure of said target space.

2. The apparatus according to claim 1, wherein the first exhausting apparatus exhausts said substrate space and makes said substrate space at a pressure of $8.0 \times 10^{-3}$ Pa or less.

3. The apparatus according to claim 2, wherein the gas introduction mechanism introduces the gas to the target space at a pressure of $1.0 \times 10^{-2}$ Pa or more.

4. The apparatus according to claim 1, wherein the second exhausting apparatus is disposed behind the target.

\* \* \* \* \*